United States Patent
Wells, Jr.

[11] Patent Number: 5,873,480
[45] Date of Patent: *Feb. 23, 1999

[54] ELECTRONIC RACK AND MOUNTING FRAME

[75] Inventor: Robert L. Wells, Jr., Thetford Center, Vt.

[73] Assignee: Hardigg Industries, Inc., Deerfield, Mass.

[*] Notice: This patent issued on a continued prosecution application filed under 37 CFR 1.53(d), and is subject to the twenty year patent term provisions of 35 U.S.C. 154(a)(2).

[21] Appl. No.: 720,206

[22] Filed: Sep. 25, 1996

[51] Int. Cl.⁶ ........................................................ B65D 7/30
[52] U.S. Cl. ........................ 220/4.02; 220/4.33; 220/4.34
[58] Field of Search ................................. 220/4.02, 4.33, 220/4.34, 4.28

[56] References Cited

U.S. PATENT DOCUMENTS

| | | | |
|---|---|---|---|
| 3,784,043 | 1/1974 | Presnick | 220/4.33 |
| 3,955,702 | 5/1976 | Lundy | 220/4.33 |
| 4,002,261 | 1/1977 | Litchfield | 220/4.33 |
| 4,284,202 | 8/1981 | Barstow, Jr. . | |
| 4,998,636 | 3/1991 | Hardigg . | |
| 5,123,541 | 6/1992 | Giannini et al. | 220/4.33 |
| 5,201,405 | 4/1993 | Noshi | 198/803.01 |
| 5,524,383 | 6/1996 | Sanko et al. | 220/4.33 |

FOREIGN PATENT DOCUMENTS

| | | |
|---|---|---|
| 0 129 056 | 12/1984 | European Pat. Off. . |
| 2 310 109 | 3/1976 | France . |
| 42 21 119 | 6/1992 | Germany . |

Primary Examiner—Joseph M. Moy
Attorney, Agent, or Firm—Fishman, Dionne, Cantor & Colburn

[57] ABSTRACT

This invention relates to an electronic rack and mounting frame for protecting sensitive electronic equipment against damage caused by impacts and excessive vibration during shipping and handling.

10 Claims, 7 Drawing Sheets

ELECTRONIC RACK AND MOUNTING FRAME

BACKGROUND OF THE INVENTION

Loading and transporting sensitive electronic equipment has presented numerous problems. Typically, such equipment is packed in a suitable shipping container. Even slight impacts or vibrations to the container, however, produce shock forces that may damage precision instruments if they are not properly supported within the container.

To adequately protect electronic equipment, it is well known to use heavy-duty containers molded from polyethylene for high impact strength. An example of this type of shipping container is disclosed in U.S. Pat. No. 4,284,202 issued Aug. 8, 1981 to Barstow Jr. It is also necessary to build into these rugged containers a shock-mitigation system that is capable of protecting the equipment from possible damage during shipping and other rough handling. One known system employs a mounting rack constructed from a plurality of welded vertical and horizontal frame members and shock mounts designed to hold the electronic equipment stationary and to absorb shocks.

The problem with that prior art electronic rack mounting frame is that the vertical and horizontal members are Gas Shielded Tungsten Arc (TIG) welded together to form an integral frame structure. Although the welded rack frame is sufficiently strong to withstand most impacts and transmit the forces produced thereby from the shock mounts to the electronic equipment without damage, there are difficulties associated with its construction.

First and foremost is the time required to weld the various frame members together and to correct any distortions caused during the welding process, which adds considerably to the cost of manufacturing the mounting rack. Because of imprecisions in the welding process, it is difficult to maintain alignment of the mounting holes which are used to secure the electronic equipment modules to the rack. A further disadvantage of a welded rack system is the storage space required to keep finished racks in stock in order to fill orders promptly.

A more recent prior art electronic rack mounting frame may be seen in U.S. Pat. No. 4,998,636. While the electronic rack mounting frame of this Patent is superior to those mentioned above, it has been found that its design requires numerous manufacturing steps and parts in order to properly fabricate the frame. One drawback which has been found is related to the use of threaded fasteners in the patented rack. The front and the rear of the rack are maintained in the desired rectangular shape by threaded fasteners creating a frictional force among parts by passing through a clearance hole in one part and into a threaded hole in another part. Tightening the screw urges the parts together. The problem (shape changing from a rectangle to a rhombus) is in large part due to the clearance hole which is larger in diameter than the fastener passed therethrough. Because of the difference in diametrical size, the only force holding the shape of the unit is the frictional force created by the clamping action of the threaded fastener; there is no structural resistance against movement. As one of skill in the art will readily recognize, moving the frame in shear against only the frictional force created by the clamping force of the fastener is orders of magnitude easier than moving the parts by shearing the fasteners. Creating a rombus from the intended rectangle is therefore relatively easy in the prior art.

Out of square racks are not favored by the purchasing industries and, therefore, are a drawback to the sales and the reputation of the producer. Remedying the condition is, therefore, desirable and important to the rack mounting frame art.

SUMMARY OF THE INVENTION

It is an object of the present invention to provide a low-cost rack and mounting frame in which fewer parts and less machining is required and where required labor for assembly is reduced compared with rack and mounting frames of the prior art.

It is a further object of the present invention to provide a rack and mounting frame that is capable of supporting electronic equipment modules inside a container and preventing damage thereto caused by impact and vibration during shipping and handling of the containers.

A further object of the present invention is to provide a rack and mounting frame having frame members that can be assembled quickly and easily in accordance with precise dimensional tolerance and that can be disassembled if desired.

It is yet another object of the invention to utilize the shear strength of the fasteners to improve the structural stability of the rack.

To accomplish these and other objects of the present invention, the electronic rack and mounting frame according to the present invention comprises a plurality of vertical and horizontal frame members of identical profile formed with a hollow interior, a plurality of identical side frame members and a one-piece corner connector for detachably securing the distal ends of vertical and horizontal frame members to form a front frame panel and a rear frame panel and for detachably securing said side frame members to said front and rear frame panels.

The vertical and horizontal frame members can be made hollow throughout their entire lengths from an extrudable, high tensile strength aluminum material. The vertical frame members of the front frame panel have a plurality of threaded mounting holes spaced a distance corresponding to the spacing of a plurality of mounting holes in the electronic equipment module that is to be mounted to the frame. In general, the holes and spacings are made up of units of three holes with ½ inch, ½ inch and ⅝ inch between them respectively. This is dictated by specification #EIA-310-D which is incorporated herein by reference. In addition, the hollow vertical and horizontal frame members have a substantially rectangular cross-section such that the frame members are defined by a front and a rear wall and a pair of side walls.

The one-piece corner connector of the present invention comprises an L-shaped device having a vertical leg portion and a horizontal leg portion which are disposed to one another at a right angle. Each leg portion is joined together at said right angle at a central portion. Said L-shaped device is also provided with an L-shaped shoulder portion depending outwardly from and in line with said leg portion. The horizontal and vertical sections of said L-shaped shoulder portion are connected to one another by a central portion which is the same in shape as the central portion which connects the leg portions of the L-shaped connector device.

The distal ends of said leg portions of the L-shaped connectors are internally received by the corresponding hollow vertical and horizontal frame members which are configured to substantially conform to the cross-sectional shape of said leg portions.

The L-shaped shoulder portion of said corner connectors is attachable via its outer surface to similarly-shaped side frame members.

As should be clear to those skilled in the art, a suitable rack and mounting frame may be produced using eight corner connectors, four vertical frame members, four horizontal frame members and four side frame members wherein said corner connectors are identical as are the vertical and horizontal frame members.

The rack and mounting frame, according to the present invention, may include additional features such as diagonally-extending frame members detachably secured to the side frame members and/or a plurality of shock mounts for supporting the frame within the hollow interior of a transport container.

Other objects, features, and characteristics of the present invention, as well as the methods, operation and functions of the related elements of the structure and the combination of parts and economies of manufacture, will become more apparent upon consideration of the following description and the appended claims with reference to the accompanying drawings, all of which form a part of this specification wherein like reference numerals designate corresponding parts in the various figures.

The above-discussed and other features and advantages of the present invention will be appreciated and understood by those skilled in the art from the following detailed description and drawings.

BRIEF DESCRIPTION OF THE DRAWINGS

Referring now to the drawings wherein like elements are numbered alike in the several Figures.

DETAILED DESCRIPTION OF THE INVENTION

Figure 1:
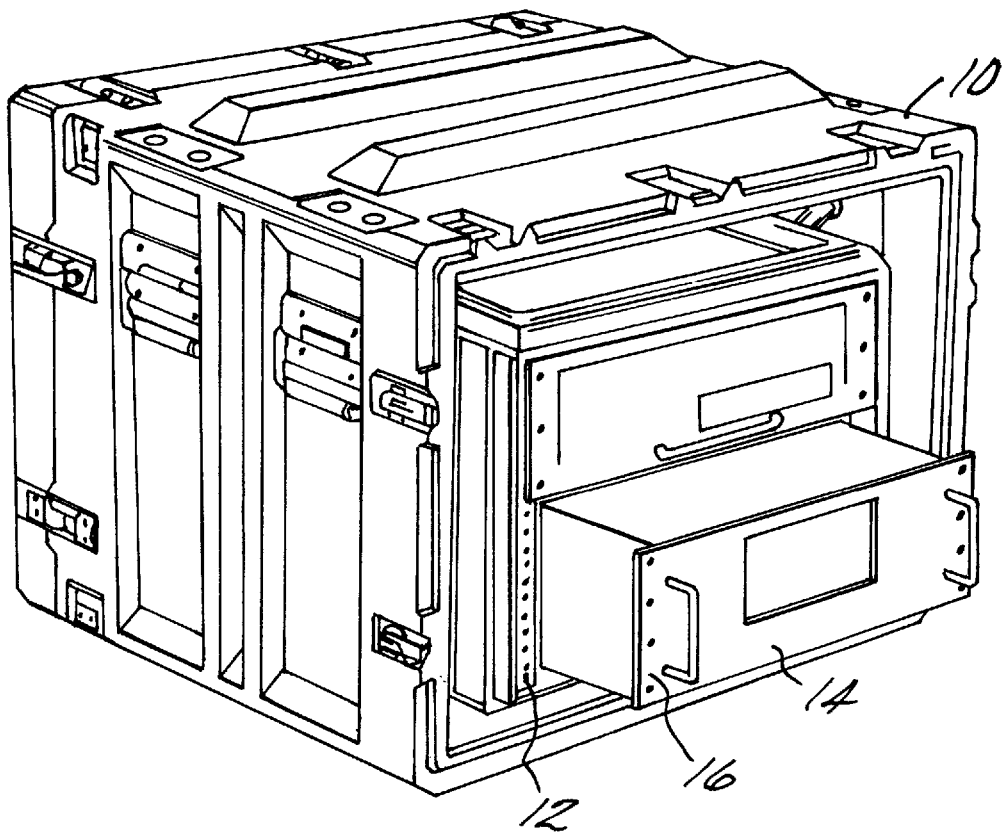
FIG. 1 is a perspective view of a prior art rack and mounting frame installed within a shipping container.

FIG. 1 is a representation of a prior art shipping and storage container 10 which contains a rack and mounting frame 12 for mounting electronic equipment thereon. The electronic equipment 14 is provided with a bezeled front panel 16 in which holes 18 are disposed for securing the equipment 14 to the frame 12.

Figure 2:
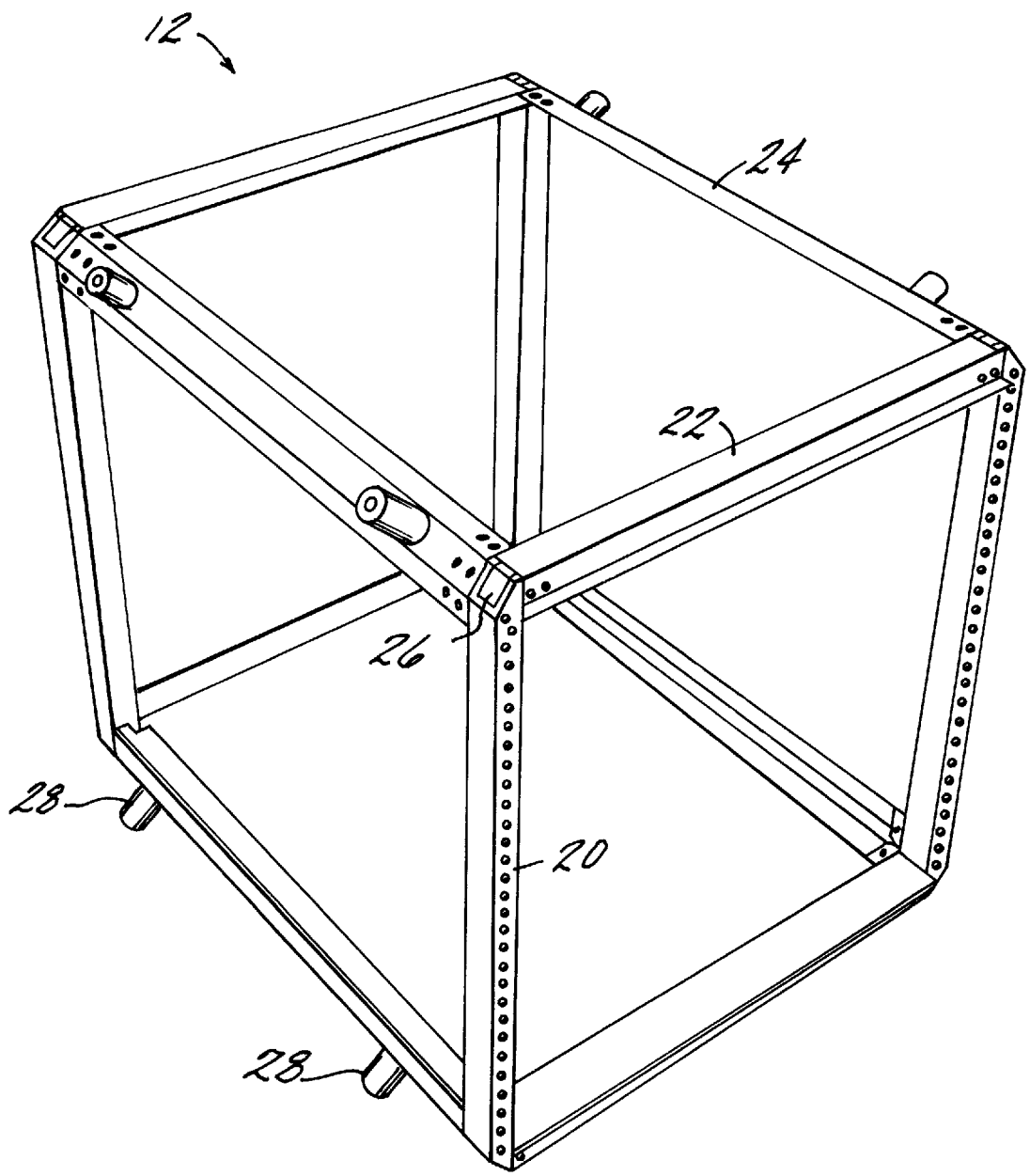
FIG. 2 is a perspective view of the prior art mounting rack described and claimed in U.S. Pat. No. 4,998,636.

As shown in FIG. 2 and fully-described in U.S. Pat. No. 4,998,636, the rack and mounting frame 12 is constructed from a plurality of vertical and horizontal members 20 and 22 and side frame members 24, all of which are preferably made from extruded, high tensile strength aluminum. The ends of each vertical 20, horizontal 22 and side frame members 24 are affixed to one another at right angles via an L-shaped internal splice member 26 and an external splice (not shown) attached to one side of said internal splice member 26.

As further shown in FIG. 2, the side frame members 24 are provided with a pair of rubber shock mounts 28 which are disposed at a 45° angle to the vertical members, in spaced relation, on each side frame member 24, running in the fore-to-aft direction. The shock mounts 28 are dimensional so that they engage brackets (not shown) mounted inside the container 10, thereby suspending the frame 12 within the hollow interior thereof While the rack and mounting frame 12 described above was an improvement over prior art frames which were welded together, said frame 12 has limitations of manufacturing in that it requires different vertical and horizontal frame members 20 and 22 which need expensive machining in order to properly receive and hold the L-shaped internal splice member 26.

Figure 3:
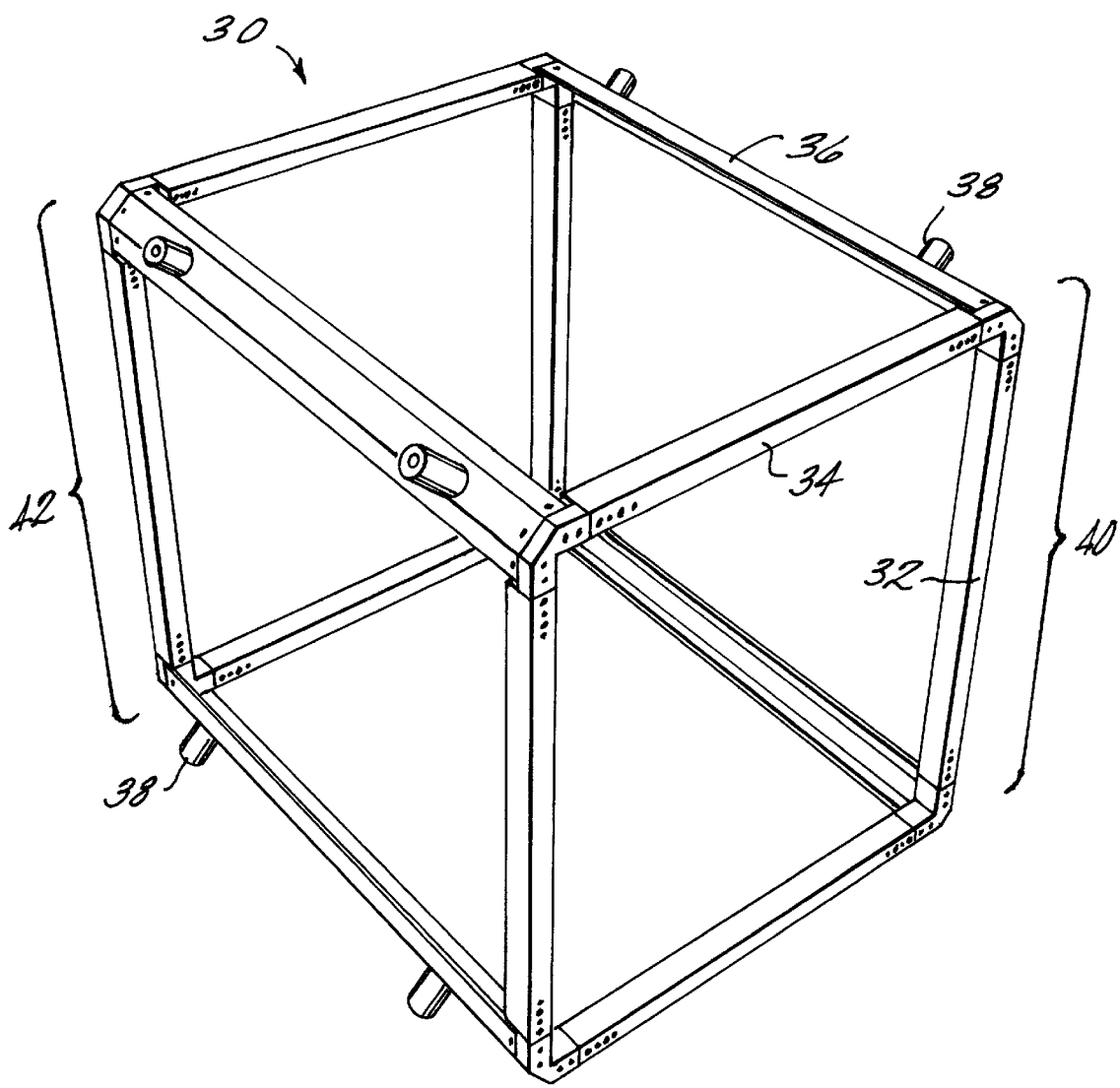
FIG. 3 is a perspective view of the assembled rack and mounting frame of the present invention.

The rack system 30, according to the present invention, is shown in FIG. 3 and is designed to overcome the deficiencies in the prior art rack system described above. Rack system 30, like the prior art device of FIG. 2, employs a rectangular, parallelpiped frame structure comprising vertical and horizontal frame members 32 and 34 and side frame members 36. The side frame members 36 are provided with a pair of shock mounts 38, similar to those disclosed in connection with the prior art device shown in FIG. 2, for mounting the rack frame 30 within the hollow interior of a transport container.

Figure 4:
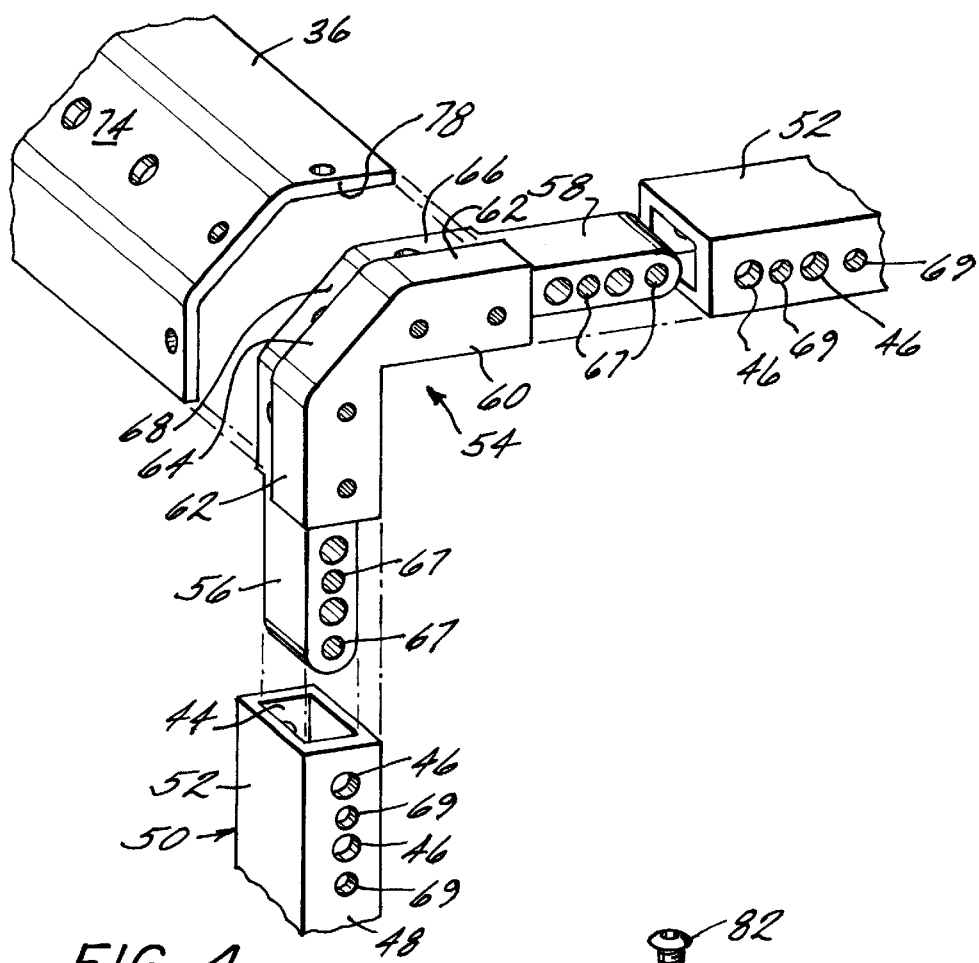
FIG. 4 is an exploded perspective view of the connection between the various frame members of the rack and mounting frame of the present invention.

The vertical and horizontal frame members 32 and 34 that make up the front and back frame panels 40 and 42 of the rack system 30 are, preferably, extruded tubing most preferably having a rectangular cross-section with parallel opposite ends and a hollow interior 44 as illustrated in FIG. 4. The tube may be hollow throughout or merely may have a receptacle end portion and otherwise be solid or otherwise obstructed. While both the horizontal and vertical frame members 32 and 34 are identical as far as their cross-section and end configuration are concerned, the vertical frame members 32 are provided with a standard pattern of threaded mounting holes 46. This standard pattern is dictated under EIA-310-D for vertical members whereas it is not necessary for the horizontal members to include these holes. The holes 46 extend the length of the front and rear walls 48 and 50 of frame members 32 for securing the front bezel panel of an electronic equipment module to the frame. In general, only the vertical frame members are employed to secure equipment. It is possible, however, to employ the horizontal members alone or in combination with the vertical members. As one of skill in the art will appreciate, however, horizontal members with no threaded holes and only pin holes are preferable, due to the cost of adding the unnecessary drilling and threading.

It should be noted that the front and back walls of the vertical frame member are most preferably 0.25" thick to provide sufficient screw thread length whereas the side walls are 0.080" thick to minimize weight of the completed rack.

Figure 5:
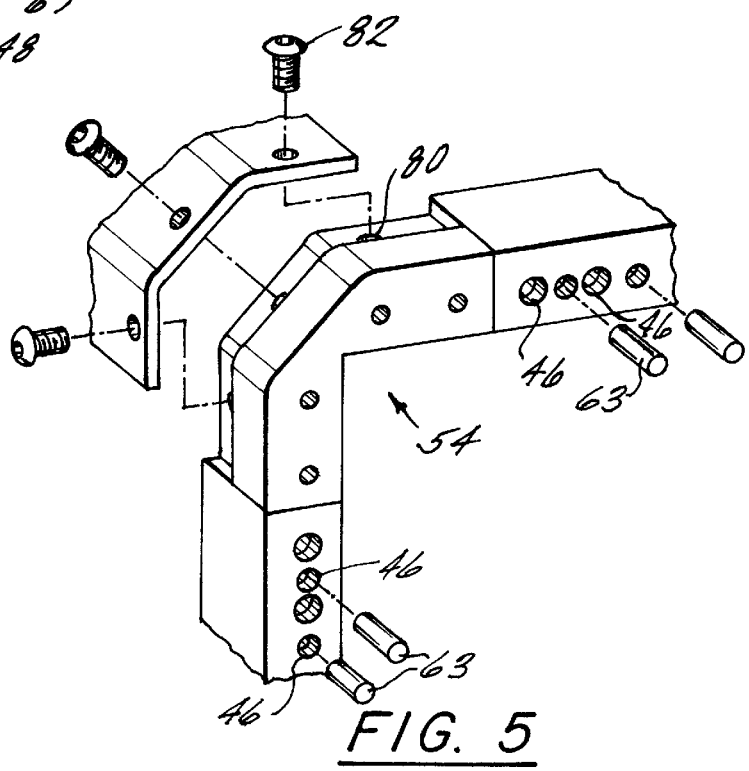
FIG. 5 is a perspective view of the connection of a side frame member to the shoulder portion of the corner connector.

As shown in FIGS. 4 and 5, the vertical frame member 32 and the horizontal frame member 34 are joined together at their distal ends 52 via L-shaped internal splice members 54. Each L-shaped internal splice member 54 comprises a vertical leg portion 56 and a horizontal leg portion 58 which are disposed and joined at right angles by a central portion 60 such that the outer face surfaces 62 of leg portions 56 and 58 form a 45° angle with the outer face surfaces 64 of the central portion 60. The leg portions 56 and 58 have a rectangular cross-section corresponding approximately to the cross-section of the hollow interiors 44 of the vertical and horizontal frame members 32 and 34. The central portion 60 has a somewhat larger cross-section so as to provide abutments for limiting the depth of insertion of the leg portions 56 and 58 into the vertical and horizontal members 32 and 34.

As also shown, the central portions 60 of the L-shaped internal splice member 54 are provided with a shoulder portion 66 which extends outward from a side surface 68 of the central portion 60. The shoulder 66 receives and supports one of the ends of side frame members 36.

It should also be noted that the L-shaped internal splice member 54 is identical for all eight corners so that only one uniquely shaped member must be fabricated for the invention.

Figure 6:
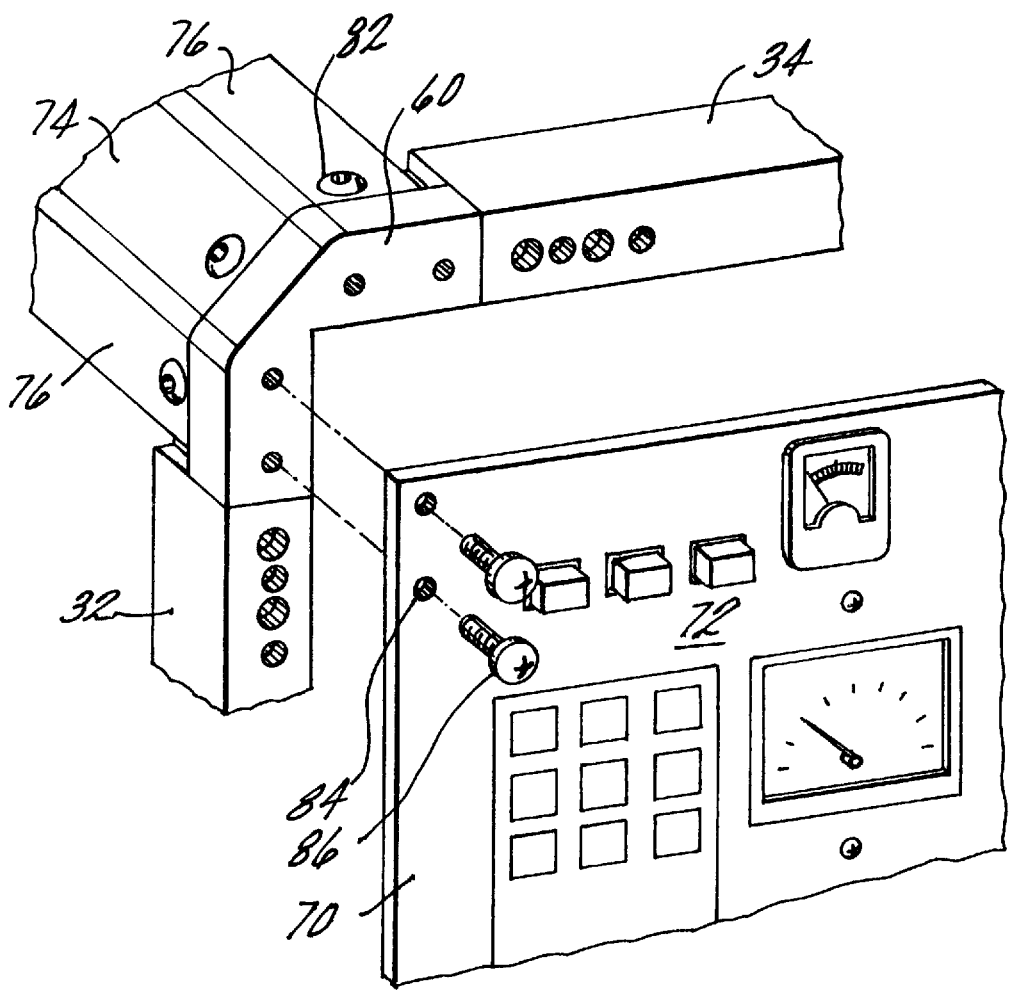
FIG. 6 is a perspective view showing the attachment of an electronic equipment module to the first panel of an assembled rack and mounting frame of the present invention.
Figure 6A:
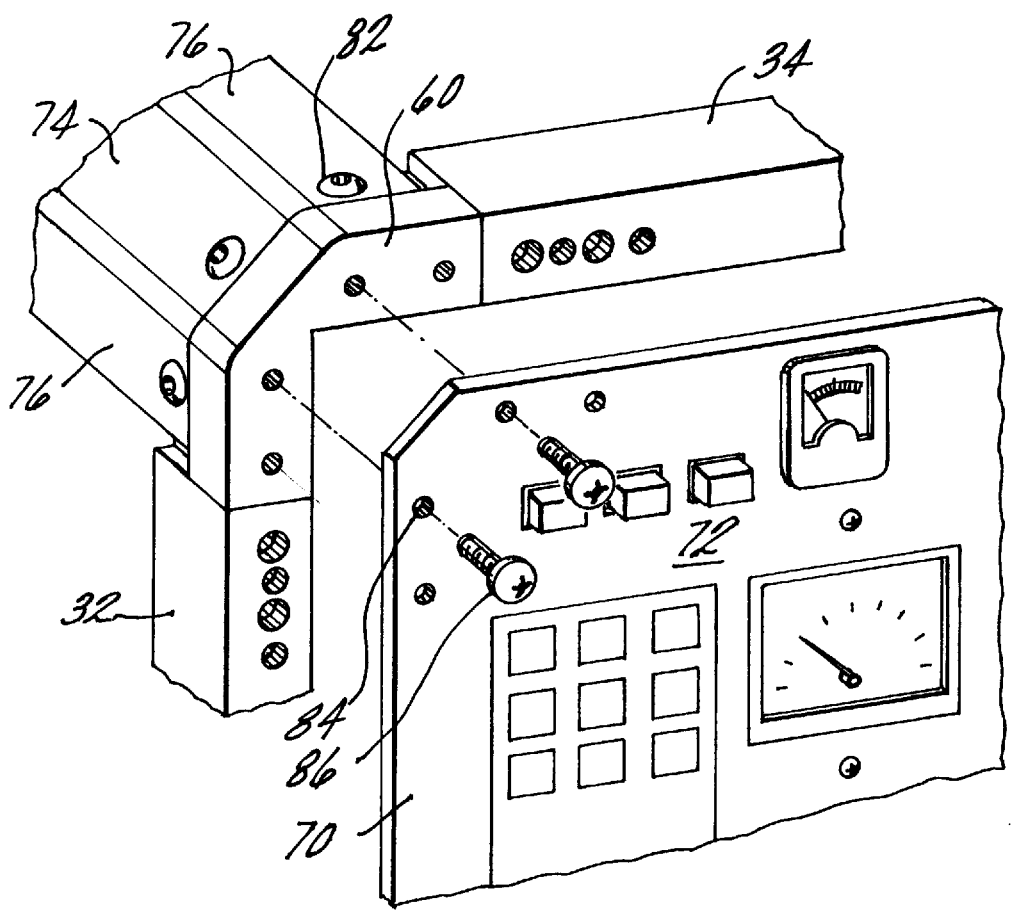
FIG. 6A is an alternate method for attachment of the equipment which the invention accommodates.

To assemble the vertical and horizontal frame members 32 and 34 of the front and rear frame panels 40 and 42, the vertical leg portion 56 of an internal splice member 54 is inserted into the hollow interior 44 of a vertical member 36 and the horizontal leg portion 58 of said splice member 54 is inserted into the hollow interior of a horizontal frame member 34. Each leg portion 56 and 58 is secured to the appropriate frame members 32 and 34 by pairs of spiral pins 63 (FIG. 5) which are inserted into pin holes 69 in said members 32 and 34 which are aligned with pin holes 67 in said leg portions 56 and 58. Spiral spring pins are preferred for their high shear strength, low insertion force, and ability to be inserted automatically. Other pins, such as roll or solid pins, could also be used. The spring pins used are headless and have a length of less than the thickness of a member 32 so that they may be wholly inserted into the pin holes 69 so as to not interfere with holes 46 and/or bezel plate 70 of an electronic equipment module 72 mounted to vertical frame members 32 (FIG. 6). Pins are superior to threaded fasteners in this type of construction because they do not require a clearance fit in one of the members that they engage. The benefit of this is that the pin has an interference fit with both members making shear movements impossible unless the force exerted is beyond the yield strength of the parts or the pins themselves. Where in the prior art, friction was the only defense against these movements. Thus, the ability of the frame of the invention to withstand forces urging it out of square are greatly increased.

The internal splice members 54 are machined to fit closely in the vertical frame members 32 in the fore-to-aft direction, but need not fit closely in the lateral direction. Said splice members 54 are also machined to provide a close fit inside the horizontal frame members 34 in the fore-to-aft direction, but not in the vertical direction.

After all of the vertical and horizontal frame members 32 and 34 have been assembled with internal splice members 54 to make up front and rear frame portions 40 and 42 of the rack frame 30, the side members 36 are ready to be assembled. As best illustrated in FIGS. 4, 5 and 6, the side members 36 are made from metal strips having a flat center portion 74 and outer portions 76 which are bent at 45° angles with respect to the center portion 74. The distal ends 78 of each side member 36 are attached at each corner of the front and rear frame portions 40 and 42 by means of the shoulder portion 66. As noted in the Figures, the shoulder portion 66 of internal splice member 54 is configured to match the configuration of the side members 36.

The shoulder portion 66 is provided with a plurality of threaded holes 80 which receive machine screws 82 which are used to hold the side members in engagement with the shoulder portions 66 of the internal splice member 54. As clearly illustrated in FIGS. 4, 5 and 6, the thickness of the side frame member corresponds to the depth of the shoulder surface 66 below the outer face surfaces 62 and 64.

After all side frame members 36 have been secured to the front and rear panel portions 40 and 42, electronic equipment modules 72 can be mounted to the rack 30 as shown in FIG. 6. Each module 72 is provided with a front bezel panel 70 which is an integral part of the module 72. Holes 84, which follow EIA standards, are provided in bezel panel 70 so that said holes 84 align with threaded holes 46 provided along the front side wall 48 of the vertical frame member 32 and on the front of splice-member 54. Screws 86 passing through holes 84 and threaded into holes 46 secure the electronic equipment module 72 to the rack 30. Depending largely upon the weight of the equipment to be secured any number of the threaded holes 46 might be employed.

Figure 7:
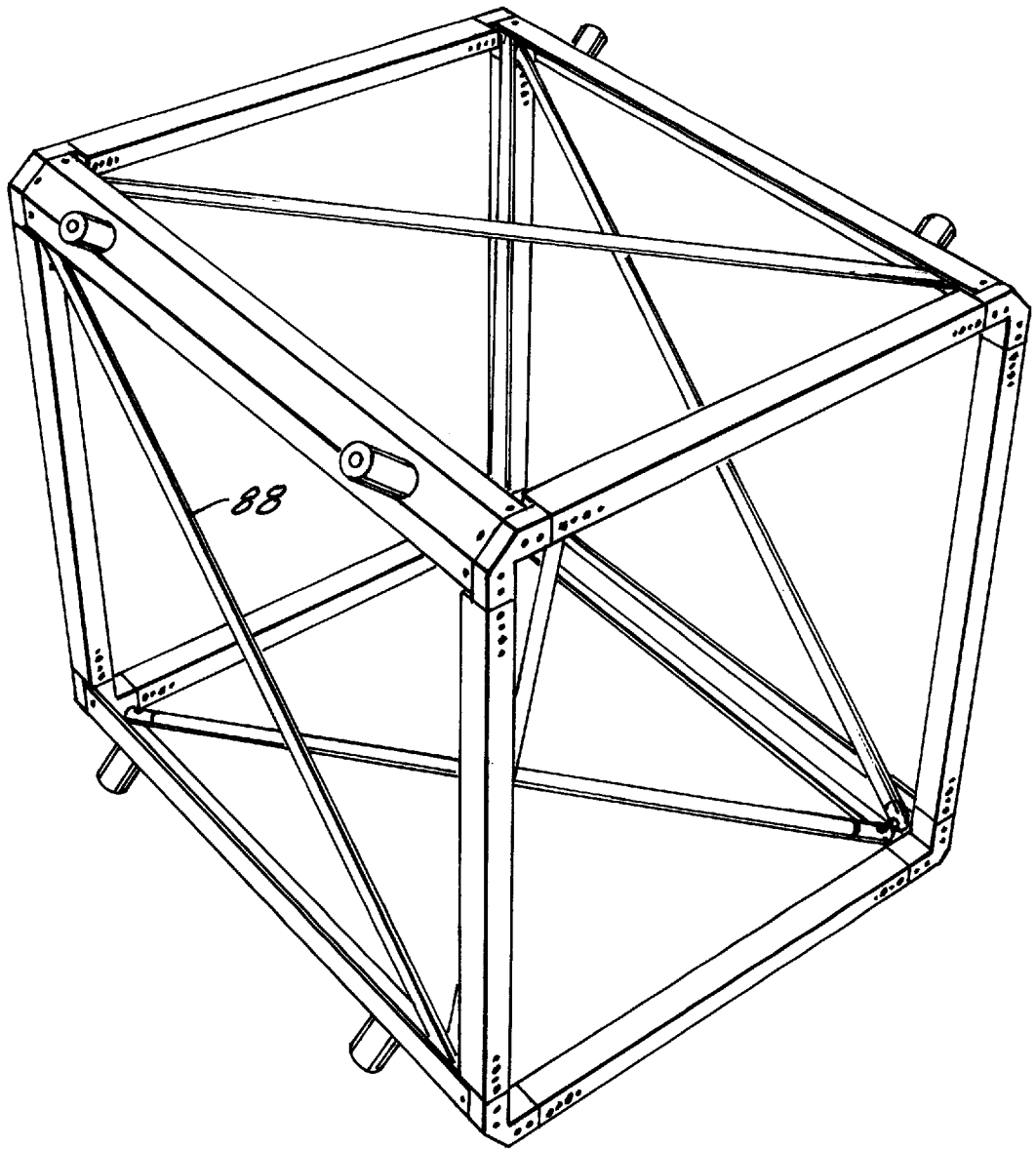
FIG. 7 is a perspective view of the rack and mounting frame of the present invention that has been further strengthened with brace members.

The construction of the rigid rack frame 30 is sufficient to withstand most impacts and vibrations transmitted through the shock mounts while preventing damage to sensitive electronic equipment secured thereto. However, should it be desirable to further strengthen the frame 30, diagonally-extending brace members 88 can be attached in the pattern illustrated in FIG. 7.

In addition to the substantial structural integrity benefits of the invention, the invention is also significantly less expensive to manufacture than prior art units.

For example:

| Prior Art | Invention |
|---|---|
| 5 unique extruded shapes | 3 unique extruded shapes |
| 11 fasteners | 7 fasteners |
| 9 screws | 3 screws |
| 2 pins | 4 pins |
| 16 machine set-ups | 11 machine set-ups |
| 16 set-ups | 11 set-ups |
| 24 steps | 15 steps |

The cost savings of this manufacture is an important advance in the art.

Although the invention has been described in connection with what is presently considered to be the most practical and preferred embodiment, it is to be understood that the invention is not to be limited to the disclosed embodiment, but, on the contrary, is intended to cover various modifications and equivalent arrangements within the scope and spirit of the appended claims, which scope is to be accorded the broadest interpretation to encompass all such modifications and equivalent structures.

What is claimed is:

1. An electronics rack and mounting frame comprising:
a plurality of horizontal frame members having two ends and having at least two pinholes therethrough on both ends thereof;
a plurality of vertical frame members having two ends and having at least two pinholes therethrough on both ends thereof;
a plurality of splice members, each splice member being engageable with at least one horizontal frame member and at least one vertical frame member, said splice members further including pin holes alignable with said at least two pinholes in each said horizontal frame members and vertical frame members; and
a plurality of pins pressed into said pin holes when said holes are aligned, said pins fastening said horizontal frame members and vertical frame members to said splice members.

2. An electronics rack and mounting frame as claimed in claim 1 wherein said horizontal frame members and said vertical frame members have axial receptacles at at least the ends thereof.

3. A rack and mounting frame as claimed in claim 2 wherein said splice members comprise a central section having a larger dimension than leg sections extending therefrom at about a 90° angle from each other, said leg sections being dimensioned to be accepted in said axial receptacles and having at least a plurality of pin receivers on each leg, said pin receivers providing an interference fit for said pins.

4. A rack and mounting frame as claimed in claim 1 wherein said plurality of splice members is eight splice members each substantially identical to the next.

5. A rack and mounting frame as claimed in claim 4 wherein said splice members further include a shoulder appended to one side surface thereof each for attachment to one of a plurality of side frame members.

6. A rack and mounting frame as claimed in claim 5 wherein each splice member is connected to a vertical frame member, a horizontal frame member and a side frame member.

7. A rack and mounting frame as claimed in claim 1 wherein said vertical members include threaded holes according to standard EIA-310-D.

8. A rack and mounting frame as claimed in claim 1 wherein said horizontal members include threaded holes.

9. An electronic rack and mounting frame as claimed in claim 1 wherein said pins are selected from spring pins, roll pins and solid pins.

10. An electronic rack and mounting frame for shipping and handling sensitive electronic equipment modules comprising:

a plurality of hollow, substantially rectangular-shaped vertical and horizontal frame members each having two opposed ends and a plurality of pin holes;

a plurality of side frame members having two opposing ends;

a plurality of internal splice members each securing an end of one vertical frame member, one horizontal frame member and one side member together, each of said internal splice member including a horizontal leg portion having pinholes therein and insertable into one end of one of said horizontal frame members, a vertical leg portion having pinholes therein and insertable into one end of one of said vertical frame members and a shoulder portion for receiving one end of one of said side frame members, said pinholes in said splice members and said pinholes in said frame members being aligned; and a plurality of pins with one pin in each of the aligned pinholes.

* * * * *